(12) United States Patent
Lapinlahti et al.

(10) Patent No.: US 12,206,416 B2
(45) Date of Patent: Jan. 21, 2025

(54) CLOCK DISTRIBUTION DEVICE, AND SIGNAL PROCESSING DEVICE AND IMAGE DISPLAY APPARATUS INCLUDING SAME

(71) Applicant: LG ELECTRONICS INC., Seoul (KR)

(72) Inventors: Mikko Lapinlahti, Seoul (KR); Klaus Jokinen, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 9 days.

(21) Appl. No.: 18/038,334

(22) PCT Filed: Nov. 19, 2021

(86) PCT No.: PCT/KR2021/017095
§ 371 (c)(1),
(2) Date: May 23, 2023

(87) PCT Pub. No.: WO2022/114685
PCT Pub. Date: Jun. 2, 2022

(65) Prior Publication Data
US 2024/0007088 A1 Jan. 4, 2024

(30) Foreign Application Priority Data
Nov. 24, 2020 (KR) .................. 10-2020-0159127

(51) Int. Cl.
*H03K 3/037* (2006.01)
*H03K 5/24* (2006.01)
*H03K 5/26* (2006.01)

(52) U.S. Cl.
CPC ............. *H03K 3/037* (2013.01); *H03K 5/249* (2013.01); *H03K 5/26* (2013.01)

(58) Field of Classification Search
CPC ............. H03K 17/04; H03K 17/04106; H03K 17/04163; H03K 17/693; H03K 19/09432;
(Continued)

(56) References Cited

U.S. PATENT DOCUMENTS

| 7,424,087 B2* | 9/2008 | Koh ..................... H03K 23/425 377/47 |
| 2017/0117886 A1* | 4/2017 | Song .................. H03K 5/00006 |
| 2018/0048298 A1 | 2/2018 | Hairapetian |

FOREIGN PATENT DOCUMENTS

| CN | 108418578 B | 6/2020 |
| JP | 2002-305440 A | 10/2002 |

(Continued)

*Primary Examiner* — Lincoln D Donovan
*Assistant Examiner* — Tyler J Pereny
(74) *Attorney, Agent, or Firm* — Birch, Stewart, Kolasch & Birch, LLP

(57) ABSTRACT

The present disclosure relates to a clock distribution device, and a signal processing device and an image display apparatus including the same. The clock distribution device according to an embodiment of the present disclosure includes: a latch configured to receive a first pulse signal among the first pulse signal and a second pulse signal having non-overlapping high levels; and a flip-flop configured to receive an inverted signal in which the second pulse signal is inverted, wherein an output clock signal is output based on an output signal of the latch, an input clock signal, and an output signal of the flip-flop. Accordingly, the input clock signal may be simply distributed.

18 Claims, 12 Drawing Sheets

(58) Field of Classification Search
CPC ......... H03K 19/215; H03K 2217/0036; H03K 3/356043; H03K 3/356139; H03K 3/3562; H03K 5/135; H03K 3/012; H03K 3/037; H03K 19/20; H03K 2005/00078; H03K 2005/00234; H03K 5/00006; H03K 5/05; G06F 1/10; G06F 1/04; G09G 2310/0237; G09G 2310/0264; G09G 2320/0247; G09G 2320/0252; G09G 2320/0646; G09G 2340/0435; G09G 3/32; G09G 3/3406; G09G 3/3426; G09G 3/3618
See application file for complete search history.

(56) References Cited

FOREIGN PATENT DOCUMENTS

| | | |
|---|---|---|
| KR | 10-2008-0018223 A | 2/2008 |
| KR | 10-2011-0039019 A | 4/2011 |

\* cited by examiner (a)          (b)          (c)

CLOCK DISTRIBUTION DEVICE, AND SIGNAL PROCESSING DEVICE AND IMAGE DISPLAY APPARATUS INCLUDING SAME

CROSS REFERENCE TO RELATED APPLICATIONS

This application is the National Phase of PCT/KR2021/017095 filed on Nov. 19, 2021, which claims priority under 35 U.S.C. § 119 (a) to Patent Application No. 10-2020-0159127 filed in the Republic of Korea on Nov. 24, 2020, all of which are hereby expressly incorporated by reference into the present application.

BACKGROUND

1. Field

The present disclosure relates to a clock distribution device, and a signal processing device and an image display apparatus including the same, and more particularly to a clock distribution device capable of simply distributing an input clock signal, and a signal processing device and an image display apparatus including the same.

2. Description of the Related Art

Recently, as the frequency of a clock signal increases in a signal processing device which is implemented as a complicated application-specific integrated circuit (ASIC), a clock distribution device is required for the signal processing device.

Meanwhile, the clock distribution device is a device for outputting clock signals of different periods in the signal processing device.

Clock signals in integer multiples may be distributed in a relatively simple manner by the clock distribution device, but considerable research is required to implement a clock distribution device having a fractional division ratio such as 1.5 times.

Meanwhile, U.S. Pat. No. 5,552,732 (hereinafter referred to as "related art 1") discloses using three flip-flops, an AND gate, and an OR gate.

However, related art 1 has a problem in that output is delayed in some of the three flip-flops, and besides, the use of the AND gate and OR gate, which are delay elements, causes a significant delay in a final output clock signal.

Meanwhile, U.S. Patent Publication Number No. US2017/0373825 (hereinafter referred to as "related art 2") discloses three or more flip-flops, a clock doubler, and the like in order to output clock signals in various multiples.

However, related art 2 has a drawback in that the clock doubler requires clock signals of various frequencies, particularly high-frequency clock signals, and thus may not be easily implemented.

SUMMARY

It is an objective of the present disclosure to provide a clock distribution device capable of simply distributing an input clock signal, and a signal processing device and an image display apparatus including the same.

It is another objective of the present disclosure to provide a clock distribution device capable of simply generating an output clock signal having a fractional division ratio based on an input clock signal, and a signal processing device and an image display apparatus including the same.

It is further another objective of the present disclosure to provide a clock distribution device capable of simply generating an output clock signal having a fractional division ratio based on a single-frequency input clock signal, and a signal processing device and an image display apparatus including the same.

In order to achieve the above objectives, a clock distribution device, and a signal processing device and an image display apparatus including the same according to an embodiment of the present disclosure include: a latch configured to receive a first pulse signal among the first pulse signal and a second pulse signal having non-overlapping high levels; and a flip-flop configured to receive an inverted signal in which the second pulse signal is inverted, wherein an output clock signal is output based on an output signal of the latch, an input clock signal, and an output signal of the flip-flop.

Meanwhile, the clock distribution device, and the signal processing device and the image display apparatus including the same according to an embodiment of the present disclosure may further include: a NAND gate configured to operate based on receiving the output signal of the latch and the input clock signal; an OR gate configured to operate based on receiving the output signal of the flip-flop and the input clock signal; and a second NAND gate configured to operate based on receiving an output signal of the NAND gate and an output signal of the OR gate, wherein the second NAND gate may output the output clock signal.

Meanwhile, the clock distribution device may be configured to: output a first clock signal based on the output signal of the NAND gate; and output a second clock signal based on the output signal of the OR gate.

Meanwhile, the clock distribution device, and the signal processing device and the image display apparatus including the same according to an embodiment of the present disclosure may further include: a first inverter configured to invert the output signal of the NAND gate; and a second inverter configured to invert the output signal of the OR gate, wherein the first clock signal may correspond to an output signal of the first inverter, and the second clock signal may correspond to an output signal of the second inverter.

Meanwhile, the second NAND gate may output the output clock signal having a period of 1.5 times a period of the input clock signal.

Meanwhile, the second NAND gate may output the output clock signal having a higher frequency than the first clock signal and the second clock signal.

Meanwhile, a frequency of the output clock signal may be twice a frequency of the first clock signal and a frequency of the second clock signal.

Meanwhile, a frequency of the output clock signal may be twice a frequency of the first clock signal or a frequency of the second clock signal.

Meanwhile, the input clock signal may be delayed by one cycle for the second pulse signal compared to the first pulse signal.

Meanwhile, a period of the first pulse signal may be three times a period of the input clock signal.

Meanwhile, an enable signal input to the latch may be a same signal as a clock signal input to the flip-flop.

Meanwhile, in response to a reset signal being input to the flip-flop, an operation of the flip-flop may be reset.

Meanwhile, a clock distribution device, and a signal processing device and an image display apparatus including the same according to another embodiment of the present disclosure include: a latch configured to receive a first pulse signal among the first pulse signal and a second pulse signal having non-overlapping high levels; an inverter configured to invert the second pulse signal; a flip-flop configured to receive an output signal of the inverter; a NAND gate configured to operate based on receiving an output signal of the latch and an input clock signal; an OR gate configured to operate based on receiving an output signal of the flip-flop and the input clock signal; and a second NAND gate configured to operate based on receiving an output signal of the NAND gate and an output signal of the OR gate, and output an output clock signal.

Effects of the Disclosure

A clock distribution device, and a signal processing device and an image display apparatus including the same according to an embodiment of the present disclosure, the clock distribution device include: a latch configured to receive a first pulse signal among the first pulse signal and a second pulse signal having non-overlapping high levels; and a flip-flop configured to receive an inverted signal in which the second pulse signal is inverted, wherein an output clock signal is output based on an output signal of the latch, an input clock signal, and an output signal of the flip-flop. Accordingly, the input clock signal may be simply distributed. Particularly, an output clock signal having a fractional division ratio may be simply generated based on the input clock signal. Further, an output clock signal having a fractional division ratio may be simply generated based on a single-frequency input clock signal.

Meanwhile, the clock distribution device, and the signal processing device and the image display apparatus including the same according to an embodiment of the present disclosure may further include: a NAND gate configured to operate based on receiving the output signal of the latch and the input clock signal; an OR gate configured to operate based on receiving the output signal of the flip-flop and the input clock signal; and a second NAND gate configured to operate based on receiving an output signal of the NAND gate and an output signal of the OR gate, wherein the second NAND gate may output the output clock signal. Accordingly, the input clock signal may be simply distributed.

Meanwhile, the clock distribution device may be configured to: output a first clock signal based on the output signal of the NAND gate; and output a second clock signal based on the output signal of the OR gate. Accordingly, the input clock signal may be simply distributed.

Meanwhile, the clock distribution device, and the signal processing device and the image display apparatus including the same according to an embodiment of the present disclosure may further include: a first inverter configured to invert the output signal of the NAND gate; and a second inverter configured to invert the output signal of the OR gate, wherein the first clock signal may correspond to an output signal of the first inverter, and the second clock signal may correspond to an output signal of the second inverter. Accordingly, the input clock signal may be simply distributed.

Meanwhile, the second NAND gate may output the output clock signal having a period of 1.5 times a period of the input clock signal. Accordingly, the output clock signal having a fractional division ratio may be simply generated based on a single-frequency input clock signal.

Meanwhile, the second NAND gate may output the output clock signal having a higher frequency than the first clock signal and the second clock signal. Accordingly, the input clock signal may be simply distributed.

Meanwhile, a frequency of the output clock signal may be twice a frequency of the first clock signal and a frequency of the second clock signal. Accordingly, the input clock signal may be simply distributed.

Meanwhile, a frequency of the output clock signal may be twice a frequency of the first clock signal or a frequency of the second clock signal. Accordingly, the input clock signal may be simply distributed.

Meanwhile, the input clock signal may be delayed by one cycle for the second pulse signal compared to the first pulse signal. Accordingly, the input clock signal may be simply distributed.

Meanwhile, a period of the first pulse signal may be three times a period of the input clock signal. Accordingly, the output clock signal having a fractional division ratio may be simply generated based on the input clock signal.

Meanwhile, an enable signal input to the latch may be a same signal as a clock signal input to the flip-flop. Accordingly, the input clock signal may be simply distributed.

Meanwhile, in response to a reset signal being input to the flip-flop, an operation of the flip-flop may be reset. Accordingly, the input clock signal may be simply distributed.

Meanwhile, a clock distribution device, and a signal processing device and an image display apparatus including the same according to another embodiment of the present disclosure include: a latch configured to receive a first pulse signal among the first pulse signal and a second pulse signal having non-overlapping high levels; an inverter configured to invert the second pulse signal; a flip-flop configured to receive an output signal of the inverter; a NAND gate configured to operate based on receiving an output signal of the latch and an input clock signal; an OR gate configured to operate based on receiving an output signal of the flip-flop and the input clock signal; and a second NAND gate configured to operate based on receiving an output signal of the NAND gate and an output signal of the OR gate, and output an output clock signal. Accordingly, the input clock signal may be simply distributed. Particularly, an output clock signal having a fractional division ratio may be simply generated based on the input clock signal. Further, an output clock signal having a fractional division ratio may be simply generated based on a single-frequency input clock signal.

DETAILED DESCRIPTION OF THE PREFERRED EMBODIMENTS

Hereinafter, the present disclosure will be described in detail with reference to the accompanying drawings.

The suffixes "module" and "unit" for elements used in the present disclosure are given simply in view of the ease of the description, and do not have a distinguishing meaning or role. Therefore, the suffixes "module" and "unit" may be used interchangeably.

Figure 1:
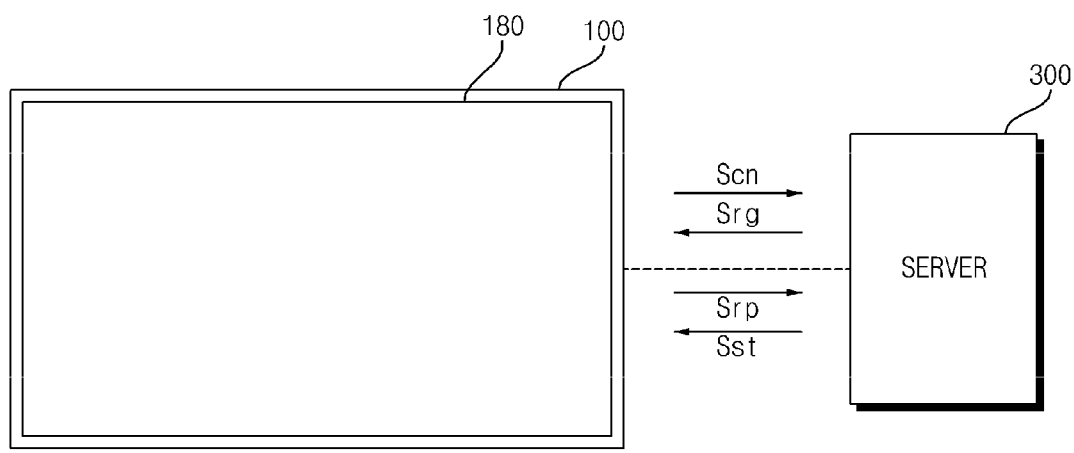
FIG. 1 is a diagram illustrating an image display apparatus according to an embodiment of the present disclosure.

FIG. 1 is a diagram illustrating an image display apparatus according to an embodiment of the present disclosure.

Referring to the drawing, an image display apparatus 100 may include a display 180.

Meanwhile, the display 180 may be implemented as one of various panels. For example, the display 180 may be any one of a liquid crystal display (LCD) panel, an organic light emitting diode panel (OLED panel), an inorganic light emitting diode panel (LED panel), and the like.

Meanwhile, the image display apparatus 100 may further include a signal processing device (170 of FIG. 2) configured to perform signal processing for image display on the display 180.

The signal processing device 170 may be implemented in the form of a system on chip (SOC).

Meanwhile, an external server 300 may transmit or stream predetermined information or video data to the image display apparatus 100.

For example, if the image display apparatus 100 is connected to the external server 300, the image display apparatus 100 may transmit an access request signal Scn to the external server 300, and the external server 300 may transmit an authentication request signal Srg to the image display apparatus 100.

In response, the image display apparatus 100 may transmit an encryption key data Srp to the external server 300, and in case in which authentication is completed by the external server 300 based on the encryption key data Srp, the image display apparatus 100 may transmit the access request signal Scn to the external server 300 and may transmit or stream predetermined information or video data Sst.

Meanwhile, the image display apparatus 100 of FIG. 1 may be a TV receiver, a monitor, a tablet, a mobile terminal, a vehicle display device, a commercial display device, signage or the like.

Figure 2:
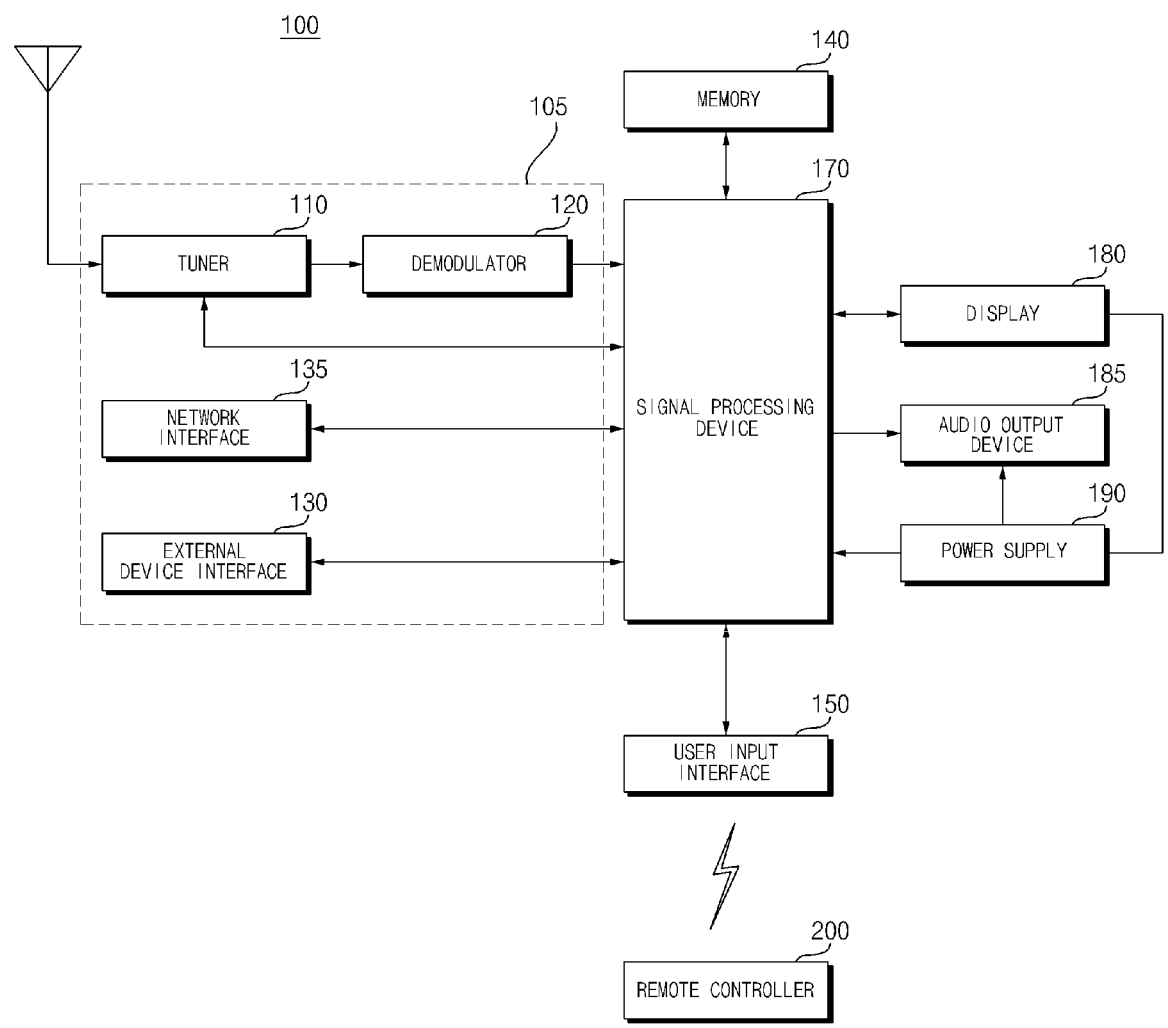
FIG. 2 is an internal block diagram illustrating an image display apparatus of FIG. 1.

FIG. 2 is an internal block diagram illustrating the image display apparatus of FIG. 1.

Referring to FIG. 2, the image display apparatus 100 according to one embodiment of the present disclosure may include an image receiver 105, an external device interface 130, a memory 140, a user input interface 150, a sensor device (not shown), a signal processing device 170, a display 180, and an audio output device 185.

The image receiver 105 may include a tuner 110, a demodulator 120, a network interface 130, and an external device interface 130.

Meanwhile, unlike the drawing, the image receiver 105 may include only the tuner 110, the demodulator 120, the external device interface 130. That is, the network interface 130 may not be included.

The tuner 110 selects a channel selected by a user from among radio frequency (RF) broadcast signals received through an antenna (not illustrated) or an RF broadcast signal corresponding to all pre-stored channels. In addition, the tuner 110 converts the selected RF broadcast signal into a middle-frequency signal, a baseband image, or a voice signal.

For example, if the selected RF broadcast signal is a digital broadcast signal, it is converted into a digital IF signal (DIF). If the selected RF broadcast signal is an analog broadcast signal, it is converted into an analog baseband image or audio signal (CVBS/SIF). That is, the tuner 110 may process a digital broadcast signal or an analog broadcast signal. The analog baseband image or audio signal (CVBS/SIF) output from the tuner 110 may be directly input to the signal processing device 170.

Meanwhile, the tuner 110 can include a plurality of tuners for receiving broadcast signals of a plurality of channels. Alternatively, a single tuner that simultaneously receives broadcast signals of a plurality of channels is also available.

The demodulator 120 receives and demodulates a digital IF (DIF) signal converted by the tuner 110.

After performing demodulation and channel decoding, the demodulator 120 may output a stream signal (TS). Herein, the stream signal may be a signal obtained by multiplexing an image signal, voice signal or data signal.

The stream signal output from the demodulator 120 may be input to the signal processing device 170. After performing demultiplexing and image/voice signal processing, the signal processing device 170 outputs an image to the display 180 and voice to the audio output device 185.

The external device interface 130 may transmit or receive data to or from a connected external device (not illustrated), for example, a set-top box 50. To this end, the external interface 130 may include an A/V input/output device.

The external device interface 130 may be connected to external devices such as a digital versatile disc (DVD) player, a Blu-ray player, a gaming device, a camera, a camcorder, a computer (laptop), and a set-top box in a wired/wireless manner, and perform input/output operations with external devices.

The A/V input/output device may receive image and voice signals of the external device. Meanwhile, a wireless transceiver (not shown) may perform short-range wireless communication with other electronic devices.

The external device interface 130 may exchange data with a neighboring mobile terminal 600 via the wireless transceiver (not illustrated). In particular, in the mirroring mode, the external device interface 130 may receive device information, information about an executed application and an application image from the mobile terminal 600.

The network interface 135 provides an interface for connecting the image display apparatus to a wired/wireless network including the Internet. For example, the network interface 135 may receive content or data provided by the Internet or a content provider or network operator through a network.

The network interface 135 may include a wireless transceiver (not illustrated).

The memory 140 may store programs for processing and control of signals in the signal processing device 170, and also store a signal-processed image, voice signal or data signal.

The memory 140 may function to temporarily store an image signal, a voice signal, or a data signal input through the external device interface 130. In addition, the memory 140 may store information about a predetermined broadcast channel through the channel memorization function such as a channel map.

While it is illustrated in FIG. 2 that the memory 140 is provided separately from the signal processing device 170, embodiments of the present disclosure are not limited thereto. The memory 140 may be included in the signal processing device 170.

The user input interface 150 may transmit a signal input by the user to the signal processing device 170 or transmit a signal from the signal processing device 170 to the user.

For example, the user input interface 150 may transmit/receive user input signals such as power on/off, channel selection, and screen setting to/from the remote controller 200, deliver user input signals input through local keys (not illustrated) such as a power key, a channel key, a volume key, or a setting key, deliver user input signals input through a sensor device (not illustrated) to sense user gestures to the signal processing device 170, or transmit a signal from the signal processing device 170 to the sensor device (not illustrated).

The signal processing device 170 may demultiplex streams input through the tuner 110, demodulator 120, network interface 135, or external device interface 130, or process demultiplexed signals. Thereby, the signal processing device 170 may generate an output signal for outputting an image or voice.

For example, the signal processing device 170 may receive a broadcast signal or HDMI signal received from the image receiver 105, perform signal processing based on the received broadcast signal or HDMI signal, and output the signal-processed image signal.

An image signal image-processed by the signal processing device 170 may be input to the display 180 and an image corresponding to the image signal may be displayed. In addition, the image signal which is image-processed by the signal processing device 170 may be input to an external output device through the external device interface 130.

A voice signal processed by the signal processing device 170 may be output to the audio output device 185 in the form of sound. In addition, the voice signal processed by the signal processing device 170 may be input to an external output device through the external device interface 130.

Although not illustrated in FIG. 2, the signal processing device 170 may include a demultiplexer, an image processor, and the like. That is, the signal processing device 170 may perform various signal processing, and thus may be implemented in the form of a System On Chip (SOC). This will be described later with reference to FIG. 3.

Additionally, the signal processing device 170 may control overall operation of the image display apparatus 100. For example, the signal processing device 170 may control the tuner 110 to tune to an RF broadcast corresponding to a channel selected by the user or a pre-stored channel.

The signal processing device 170 may control the image display apparatus 100 according to a user command input through the user input interface 150 or an internal program.

The signal processing device 170 may control the display 180 to display an image. Herein, the image displayed on the display 180 may be a still image, a moving image, a 2D image, or a 3D image.

The signal processing device 170 may be configured to display the predetermined object in an image displayed on the display 180. For example, the object may be at least one of an accessed web page (a newspaper, a magazine, or the like), electronic program guide (EPG), various menus, a widget, an icon, a still image, a moving image, or text.

The signal processing device 170 may recognize the location of the user based on an image captured by a capture device (not illustrated). For example, the signal processing device 170 may recognize a distance (a z-axis coordinate) between the user and the image display apparatus 100. Additionally, the signal processing device 170 may recognize an x-axis coordinate and a y-axis coordinate corresponding to the location of the user in the display 180.

The display 180 generates drive signals by converting an image signal, data signal, OSD signal, and control signal processed by the signal processing device 170 or an image signal, data signal, and control signal received from the external device interface 130.

The display 180 may be configured as a touch screen and used as an input device in addition to an output device.

The audio output device 185 receives a voice signal processed by the signal processing device 170 and outputs voice.

The capture device (not illustrated) captures the user. The capture device (not illustrated) may be implemented with one camera, but is not limited thereto, and may be implemented with a plurality of cameras. Image information captured by the capture device (not illustrated) may be input to the signal processing device 170.

The signal processing device 170 may sense user gestures based on an image captured by the capture device (not illustrated), a sensed signal from the sensor device (not illustrated), or a combination thereof.

The power supply 190 supplies corresponding power throughout the image display apparatus 100. In particular, the power supply 190 may supply power to the signal processing device 170 implemented in the form of a System On Chip (SOC), the display 180 for displaying images, an audio output device 185 for outputting audio, or the like.

Specifically, the power supply 190 may include a AC-DC converter to convert alternating current (AC) voltage into direct current (DC) voltage and a DC-DC converter to change the level of the DC voltage.

The remote controller 200 transmits user input to the user input interface 150. To this end, the remote controller 200 may employ Bluetooth, radio frequency (RF) communication, infrared (IR) communication, ultra-wideband (UWB), or ZigBee. In addition, the remote controller 200 may receive an image signal, a voice signal, or a data signal output from the user input interface 150, and display the signals on the remote controller 200 or voice-output.

The image display apparatus 100 may be a fixed or mobile digital broadcast receiver capable of receiving digital broadcast services.

The block diagram of the image display apparatus 100 illustrated in FIG. 2 is a block diagram for one embodiment of the present disclosure. Constituents of the block diagram may be integrated, added or omitted according to the specifications of the image display apparatus 100 which is implemented in reality. That is, two or more constituents may be combined into one constituent, or one constituent may be subdivided into two or more constituents, in case in which necessary. In addition, the function performed in each block is simply illustrative, and it should be noted that specific operations or devices of the blocks do not limit the scope of the present disclosure.

Figure 3:
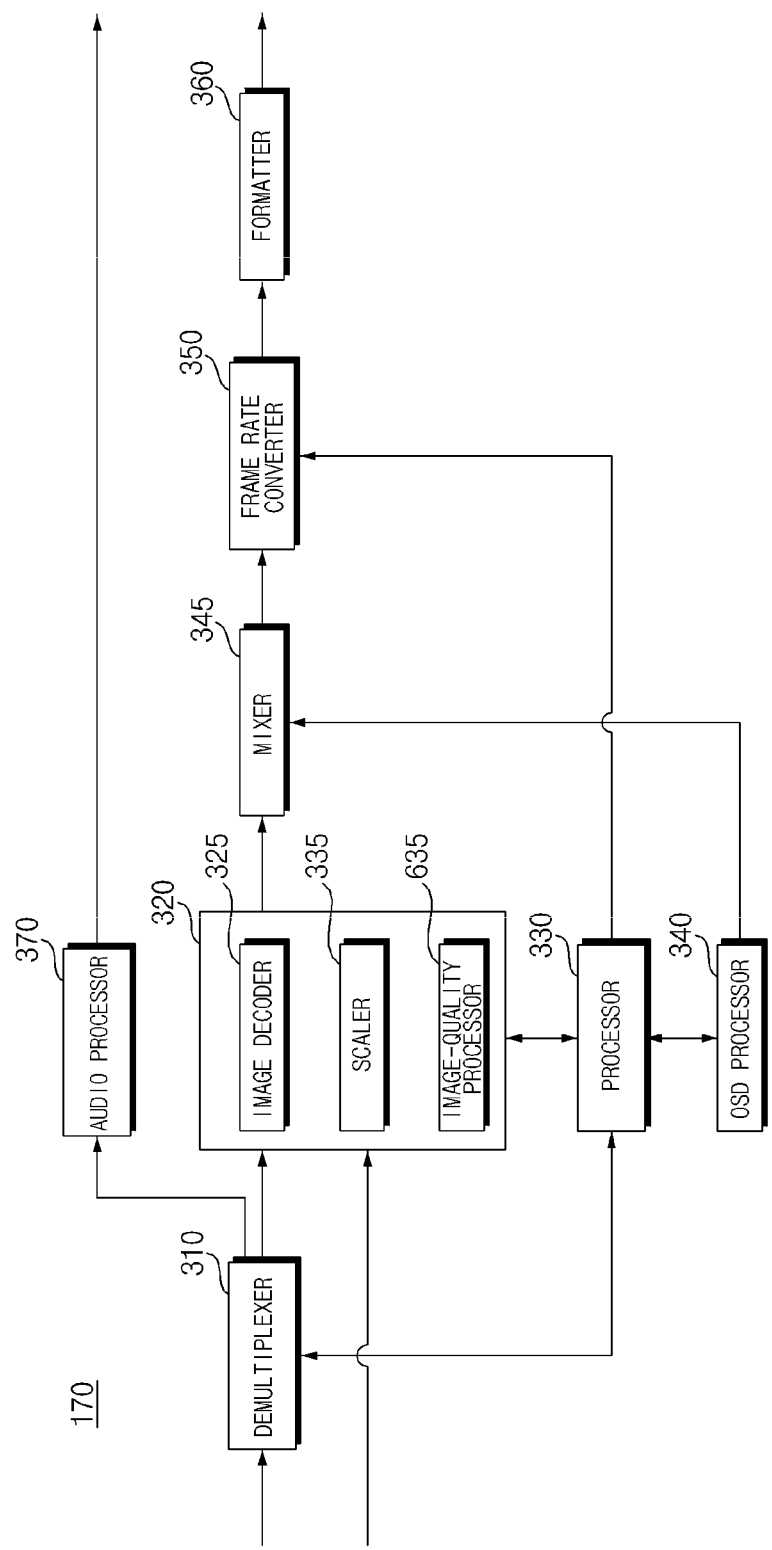
FIG. 3 is an internal block diagram illustrating a signal processing device of FIG. 2.

FIG. 3 is an internal block diagram illustrating the signal processing device of FIG. 2.

Referring to the drawing, the signal processing device 170 according to one embodiment of the present disclosure may include a demultiplexer 310, an image processor 320, a processor 330, and an audio processor 370. In addition, the signal processing device 170 may further include a data processor (not illustrated).

The demultiplexer 310 demultiplexes an input stream. For example, in case in which an MPEG-2 TS is input, the demultiplexer 310 may demultiplex the MPEG-2 TS to separate the MPEG-2 TS into an image signal, a voice signal and a data signal. Herein, the stream signal input to the demultiplexer 310 may be a stream signal output from the tuner 110, the demodulator 120 or the external device interface 130.

The image processor 320 may perform signal processing on an input image. For example, the image processor 320 may perform image processing of an image signal demultiplexed by the demultiplexer 310.

To this end, the image processor 320 includes an image decoder 325, a scaler 335, an image-quality processor 635, an image encoder (not illustrated), an OSD processor 340, a frame rate converter 350, and a formatter 360, and the like.

The image decoder 325 decodes the demultiplexed image signal, and the scaler 335 scales the resolution of the decoded image signal such that the image signal can be output through the display 180.

The image decoder 325 may include decoders of various standards. For example, the image decoder 325 may include an MPEG-2 decoder, an H.264 decoder, a 3D image decoder for color images and depth images, and a decoder for multi-viewpoint images.

The scaler 335 may scale an input image signal that has been image decoded by the image decoder 325 or the like.

For example, the scaler 335 may perform up-scaling in case in which the size or resolution of the input image signal is small, and down-scaling in case in which the size or resolution of the input image signal is large.

The image-quality processor 635 may perform image quality processing on an input image signal that has been image decoded in the image decoder 325 or the like.

For example, the image-quality processor 635 may perform noise removal processing of the input image signal, expand the resolution of gray levels of an input image signal, improve image resolution, perform high dynamic range (HDR) based signal processing, change the frame rate, or perform image quality processing corresponding to panel characteristics, particularly organic light emitting panels or the like.

The OSD processor 340 generates an OSD signal automatically or according to user input. For example, the OSD processor 340 may generate a signal for display of various kinds of information in the form of images or text on the screen of the display 180 based on a user input signal. The generated OSD signal may include various data including the user interface screen window of the image display apparatus 100, various menu screen windows, widgets, and icons. The generated OSD signal may also include a 2D object or a 3D object.

The OSD processor 340 may generate a pointer which can be displayed on the display, based on a pointing signal input from the remote controller 200. In particular, the pointer may be generated by a pointing signal processing device (not illustrated), and the OSD processor 340 may include the pointing signal generator. Of course, it is possible to provide the pointing signal processing device (not illustrated) separately from the OSD processor 340.

The frame rate converter (FRC) 350 may convert the frame rate of an input image. The FRC 350 may output frames without performing separate frame rate conversion.

The formatter 360 may change the format of an input image signal into an image signal for display on a display and output the changed image signal.

In particular, the formatter 360 may change the format of the image signal to correspond to the display panel.

Meanwhile, the formatter 360 may change the format of an image signal. For example, the format of the 3D image signal may be changed to any one format of various 3D formats such as a Side by Side format, a Top/Down format, a Frame Sequential format, an Interlaced format, a Checker Box format.

The processor 330 may control overall operations within the image display apparatus 100 or signal processing device 170.

For example, the processor 330 may control the tuner 110 to select (tuning) an RF broadcast corresponding to a channel selected by a user or a pre-stored channel.

The processor 330 may control the image display apparatus 100 according to a user command input through the user input interface 150 or an internal program.

The processor 330 may perform data transfer control with the network interface 135 or the external device interface 130.

The processor 330 may control operations of the demultiplexer 310 and the image processor 320 within the signal processing device 170.

An audio processor 370 in the signal processing device 170 may voice-process a demultiplexed voice signal. To this end, the audio processor 370 may include various decoders.

The audio processor 370 in the signal processing device 170 may perform processing such as adjustment of bass, treble, and volume.

The data processor (not illustrated) in the signal processing device 170 may perform data processing on a demultiplexed data signal. For example, in case in which the demultiplexed data signal is a coded data signal, the data processor (not illustrated) may decode the data signal. The coded data signal may be electronic program guide information including broadcast information such as a start time and end time of a broadcast program broadcast on each channel.

The block diagram of the signal processing device 170 illustrated in FIG. 3 is a block diagram for one embodiment of the present disclosure. Constituents of the block diagram may be integrated, added, or omitted according to the specifications of the signal processing device 170 which is implemented in reality.

In particular, the frame rate converter 350 and the formatter 360 may be separately provided in addition to the image processor 320.

Figure 4A:
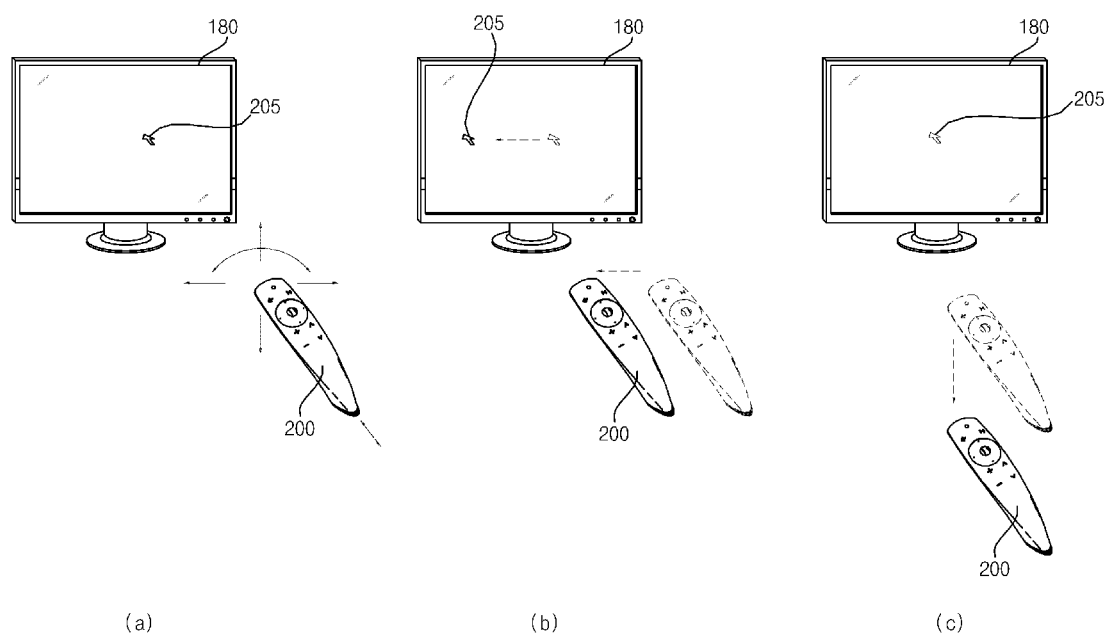
FIG. 4A illustrates a method for controlling a remote controller of FIG. 2.

FIG. 4A illustrates a method for controlling the remote controller of FIG. 2.

As illustrated in FIG. 4A(a), a pointer 205 corresponding to the remote controller 200 may be displayed on the display 180.

The user may move the remote controller 200 up and down, left and right (FIG. 4A(b)), or back and forth (FIG. 4A(c)) or rotate the same. The pointer 205 displayed on the display 180 of the image display apparatus corresponds to movement of the remote controller 200. As illustrated in the drawings, since the pointer 205 moves according to movement of the remote controller 200 in the 3D space, the remote controller 200 may be referred to as a spatial remote control or a 3D pointing device.

FIG. 4A(b) illustrates a case where the pointer 205 displayed on the display 180 of the image display apparatus moves to the left in case in which the user moves the remote controller 200 to the left.

Information about movement of the remote controller 200 sensed through a sensor of the remote controller 200 is transmitted to the image display apparatus. The image display apparatus may calculate coordinates of the pointer 205 based on the information about the movement of the remote controller 200. The image display apparatus may display the pointer 205 such that the pointer 205 corresponds to the calculated coordinates.

FIG. 4A(c) illustrates a case where the user moves the signal processing device 170 away from display 180 in a state where the user presses down a specific button in the remote controller 200. In this case, a selected area on the display 180 corresponding to the pointer 205 may be zoomed in and displayed with the size thereof increased. On the other hand, in case in which the user moves the remote controller 200 closer to the display 180, the selected area in the display 180 corresponding to the pointer 205 may be zoomed out and displayed with the size thereof reduced. Alternatively, the selected area may be zoomed out in case in which the remote controller 200 moves away from the display 180, and may be zoomed in in case in which the remote controller 200 moves closer to the display 180.

Vertical and lateral movement of the remote controller 200 may not be recognized while the specific button in the remote controller 200 is pressed down. That is, in case in which the remote controller 200 approaches or moves away from the display 180, vertical and lateral movements thereof may not be recognized, but back-and-forth movement thereof may be recognized. In case in which the specific button in the remote controller 200 is not pressed down, the pointer 205 only moves according to vertical and lateral movements of the remote controller 200.

The speed and direction of movement of the pointer 205 may correspond to the speed and direction of movement of the remote controller 200.

Figure 4B:
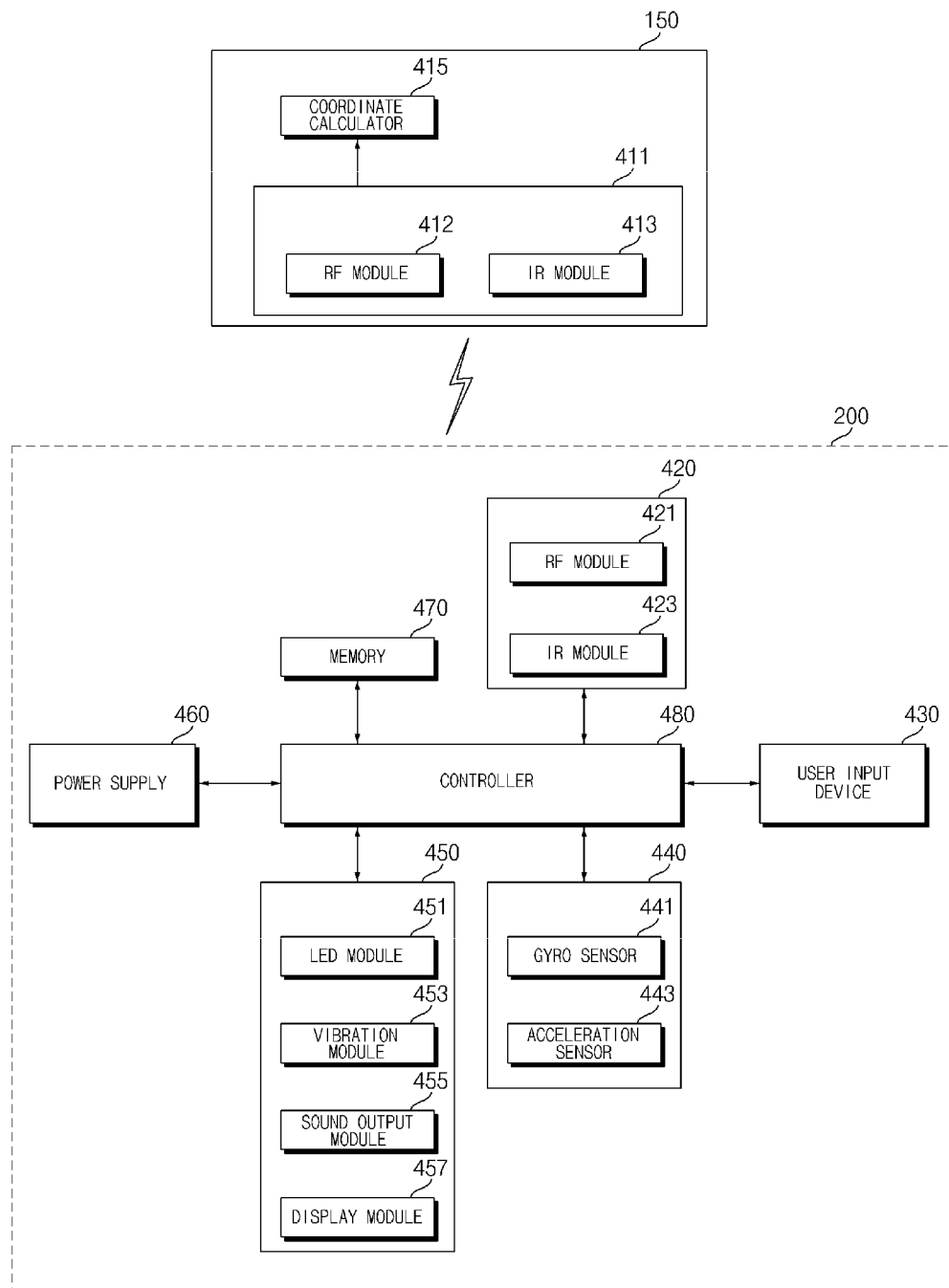
FIG. 4B is an internal block diagram illustrating the remote controller of FIG. 2.

FIG. 4B is an internal block diagram illustrating the remote controller of FIG. 2.

Referring to the drawing, the remote controller 200 may include a wireless transceiver 425, a user input device 430, a sensor device 440, an output device 450, a power supply 460, a memory 470, and a controller 480.

The wireless transceiver 425 transmits and receives signals to and from one of the image display apparatuses according to embodiments of the present disclosure described above. Hereinafter, one image display apparatus 100 according to one embodiment of the present disclosure will be described.

In this embodiment, the remote controller 200 may include an RF module 421 capable of transmitting and receiving signals to and from the image display apparatus 100 according to an RF communication standard. The remote controller 200 may further include an IR module 423 capable of transmitting and receiving signals to and from the image display apparatus 100 according to an IR communication standard.

In this embodiment, the remote controller 200 transmits a signal including information about movement of the remote controller 200 to the image display apparatus 100 via the RF module 421.

In addition, the remote controller 200 may receive a signal from the image display apparatus 100 via the RF module 421. In case in which necessary, the remote controller 200 may transmit commands related to power on/off, channel change, and volume change to the image display apparatus 100 via the IR module 423.

The user input device 430 may include a keypad, a button, a touchpad, or a touchscreen. The user may input a command related to the image display apparatus 100 with the remote controller 200 by manipulating the user input device 435. In case in which the user input device 435 includes a hard key button, the user may input a command related to the image display apparatus 100 with the remote controller 200 by pressing the hard key button. In case in which the user input device 435 includes a touchscreen, the user may input a command related to the image display apparatus 100 with the remote controller 200 by touching a soft key on the touchscreen. The user input device 430 may include various kinds of input means such as a scroll key and a jog key which are manipulatable by the user, but it should be noted that this embodiment does not limit the scope of the present disclosure.

The sensor device 440 may include a gyro sensor 441 or an acceleration sensor 443. The gyro sensor 441 may sense information about movement of the remote controller 200.

For example, the gyro sensor 441 may sense information about movement of the remote controller 200 with respect to the X, Y and Z axes. The acceleration sensor 443 may sense information about the movement speed of the remote controller 200. The sensor device 440 may further include a distance measurement sensor to sense a distance to the display 180.

The output device 450 may output an image signal or voice signal corresponding to manipulation of the user input device 435 or a signal transmitted from the image display apparatus 100. The user may recognize, via the output device 450, whether the user input device 435 is manipulated or the image display apparatus 100 is controlled.

For example, the output device 450 may include an LED module 451 to be turned on in case in which the user input device 35 is operated or signals are transmitted to and received from the image display apparatus 100 via the wireless transceiver 425, a vibration module 453 to generate vibration, a sound output module 455 to output sound, or a display module 457 to output an image.

The power supply 460 supplies power to the remote controller 200. In case in which the remote controller 200 does not move for a predetermined time, the power supply 460 may stop supplying power to save power. The power supply 460 may resume supply of power in case in which the predetermined key provided to the remote controller 200 is manipulated.

The memory 470 may store various kinds of programs and application data necessary for control or operation of the remote controller 200. In case in which the remote controller 200 wirelessly transmits and receives signals to and from the image display apparatus 100 via the RF module 421, the remote controller 200 and the image display apparatus 100 may transmit and receive signals in a predetermined frequency band. The controller 480 of the remote controller 200 may store, in the memory 470, information about, for example, a frequency band enabling wireless transmission and reception of signals to and from the image display apparatus 100 which is paired with the remote controller 200, and reference the same.

The controller 480 controls overall operation related to control of the remote controller 200. The controller 480 may transmit, via the wireless transceiver 425, a signal corresponding to manipulation of a predetermined key in the user input device 435 or a signal corresponding to movement of the remote controller 200 sensed by the sensor device 440 to the image display apparatus 100.

The user input interface 150 of the image display apparatus 100 may include a wireless transceiver 151 capable of wirelessly transmitting and receiving signals to and from the remote controller 200 and a coordinate calculator 415 capable of calculating coordinates of the pointer corresponding to operation of the remote controller 200.

The user input interface 150 may wirelessly transmit and receive signals to and from the remote controller 200 via an RF module 412. In addition, the user input interface 150 may receive, via an IR module 413, a signal transmitted from the remote controller 200 according to an IR communication standard.

The coordinate calculator 415 may calculate coordinates (x, y) of the pointer 205 to be displayed on the display 180, by correcting hand tremor or an error in a signal corresponding to operation of the remote controller 200 which is received via the wireless transceiver 151.

The transmitted signal of the remote controller 200 input to the image display apparatus 100 via the user input interface 150 is transmitted to the signal processing device 170 of the image display apparatus 100. The signal processing device 170 may determine information about an operation of the remote controller 200 or manipulation of a key from the signal transmitted from the remote controller 200, and control the image display apparatus 100 according to the information.

As another example, the remote controller 200 may calculate coordinates of the pointer corresponding to movement thereof and output the same to the user input interface 150 of the image display apparatus 100. In this case, the user input interface 150 of the image display apparatus 100 may transmit, to the signal processing device 170, information about the received coordinates of the pointer without separately correcting hand tremor or the error.

As another example, in contrast with the example of the drawing, the coordinate calculator 415 may be provided in the signal processing device 170 rather than in the user input interface 150.

Figure 5:
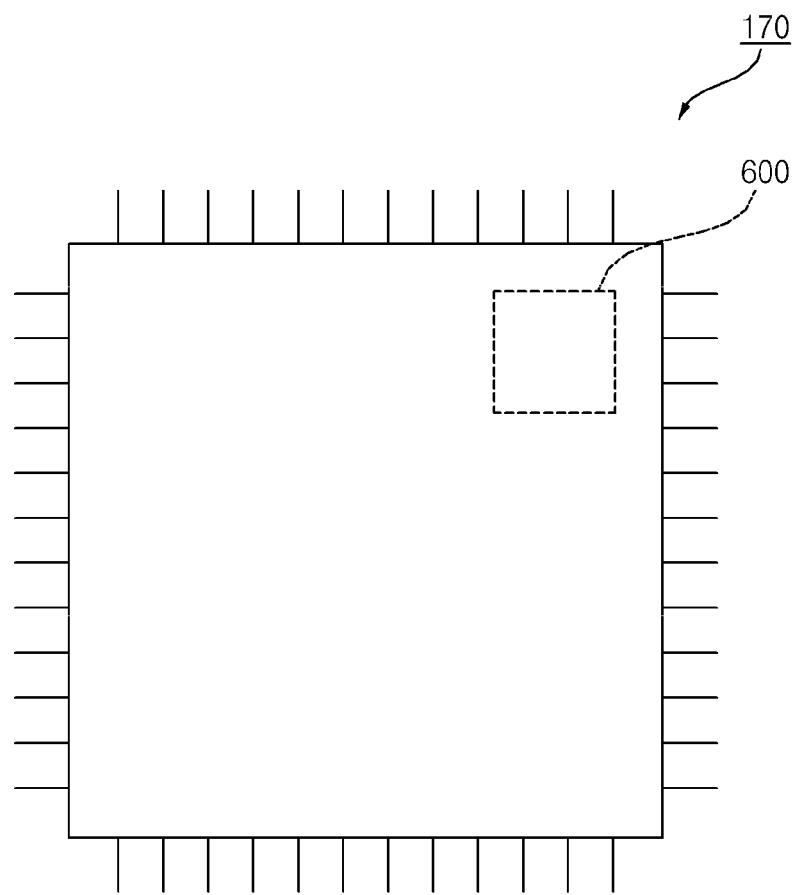
FIG. 5 is a diagram illustrating the appearance of a signal processing device according to an embodiment of the present disclosure.

FIG. 5 is a diagram illustrating the appearance of a signal processing device according to an embodiment of the present disclosure.

Referring to the drawing, the signal processing device 170 in the form of a system-on-chip (SOC) may include a plurality of terminals to transmit or receive signals.

Meanwhile, the signal processing device 170 according to an embodiment of the present disclosure includes a clock distribution device 600, and some of the plurality of terminals may be used for the operation of the clock distribution device 600.

For example, the signal processing device 170 may receive a clock signal from an external source through some of the plurality of terminals.

Further, the signal processing device 170 may perform signal processing based on the received clock signal.

Meanwhile, the clock distribution device 600 is required in the case where clock signals of various frequencies are used in the signal processing device 170.

Accordingly, the clock distribution device 600 according to an embodiment of the present disclosure outputs an output clock signal having a fractional division ratio based on a single-frequency input clock signal. Accordingly, the clock distribution device 600 may simply distribute the input clock signal. Particularly, the clock distribution device 600 may simply generate an output clock signal having a fractional division ratio based on the input clock signal, which will be described below with reference to FIG. 6 and the following figures.

Figure 6:
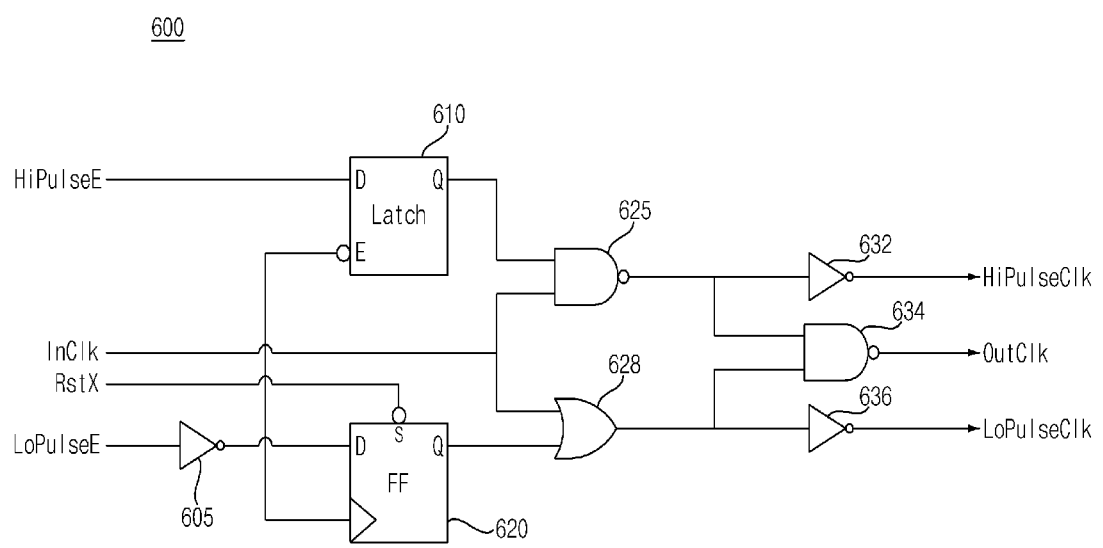
FIG. 6 is an example of a circuit diagram illustrating a clock distribution device according to an embodiment of the present disclosure.

FIG. 6 is an example of a circuit diagram illustrating a clock distribution device according to an embodiment of the present disclosure.

Referring to the drawing, the clock distribution device 600 according to an embodiment of the present disclosure may include: a latch 610 to which, of a first pulse signal HiPulseE and a second pulse signal LoPulseE which have high levels that do not overlap each other, the first pulse signal HiPulseE is input; and a flip-flop 620 to which the second pulse signal LoPulseE, which is inverted, is input.

Further, the clock distribution device 600 outputs an output clock signal OutClk based on an output signal of the latch 610, an input clock signal InClk, and an output signal of the flip-flop 620.

Accordingly, the clock distribution device 600 may simply distribute the input clock signal InClk. Particularly, the clock distribution device 600 may simply generate the output clock signal OutClk having a fractional division ratio based on the input clock signal InClk. Further, the clock distribution device 600 may simply generate the output clock signal OutClk having a fractional division ratio based on a single-frequency input clock signal InClk.

Meanwhile, the clock distribution device 600 according to an embodiment of the present disclosure may further include: a NAND gate 625 that operates by receiving the output signal of the latch 610 and the input clock signal InClk; an OR gate 628 that operates by receiving the output signal of the flip-flop 620 and the input clock signal InClk; and a second NAND gate 634 that operates by receiving an output signal of the NAND gate 625 and an output signal of the OR gate 628.

Further, in the clock distribution device 600, the second NAND gate 634 may output the output clock signal OutClk. Accordingly, the input clock signal InClk may be simply distributed.

Meanwhile, the clock distribution device 600 according to an embodiment of the present disclosure may output a first clock signal HiPulseEClk based on the output signal of the NAND gate 625, and may output a second clock signal LoPulseEClk based on the output signal of the OR gate 628, thereby simply distributing the input clock signal InClk.

Meanwhile, the clock distribution device 600 according to an embodiment of the present disclosure may further include a first inverter 632 inverting the output signal of the NAND gate 625, and a second inverter 636 inverting the output signal of the OR gate 628.

Meanwhile, the first clock signal HiPulseEClk may correspond to an output signal of the first inverter 632, and the second clock signal LoPulseEClk may correspond to an output signal of the second inverter 636. Accordingly, the input clock signal InClk may be simply distributed.

Meanwhile, an enable signal input to the latch 610 may be the same signal as a clock signal input to the flip-flop 620. Accordingly, the input clock signal InClk may be simply distributed.

Meanwhile, if a reset signal RstX is input to the flip-flop 620, the operation of the flip-flop 620 may be reset. Accordingly, the input clock signal InClk may be simply distributed.

Meanwhile, referring to FIG. 6, the clock distribution device 600 according to another embodiment of the present disclosure includes: a latch 610 to which, of a first pulse signal HiPulseE and a second pulse signal LoPulseE which have high levels that do not overlap each other, the first pulse signal HiPulseE is input; an inverter 605 inverting the second pulse signal LoPulseE; a flip-flop 620 to which an output signal of the inverter 605 is input; a NAND gate 625 that operates by receiving an output signal of the latch 610 and an input clock signal InClk; an OR gate 628 that operates by receiving an output signal of the flip-flop 628 and the input clock signal InClk; and a second NAND gate 634 that operates by receiving an output signal of the NAND gate 625 and an output signal of the OR gate 628, and outputs an output clock signal OutClk.

Accordingly, the input clock signal InClk may be simply distributed. Particularly, the output clock signal OutClk having a fractional division ratio may be simply generated based on the input clock signal InClk. Further, the output clock signal OutClk having a fractional division ratio may be simply generated based on a single-frequency input clock signal InClk.

Figure 7:
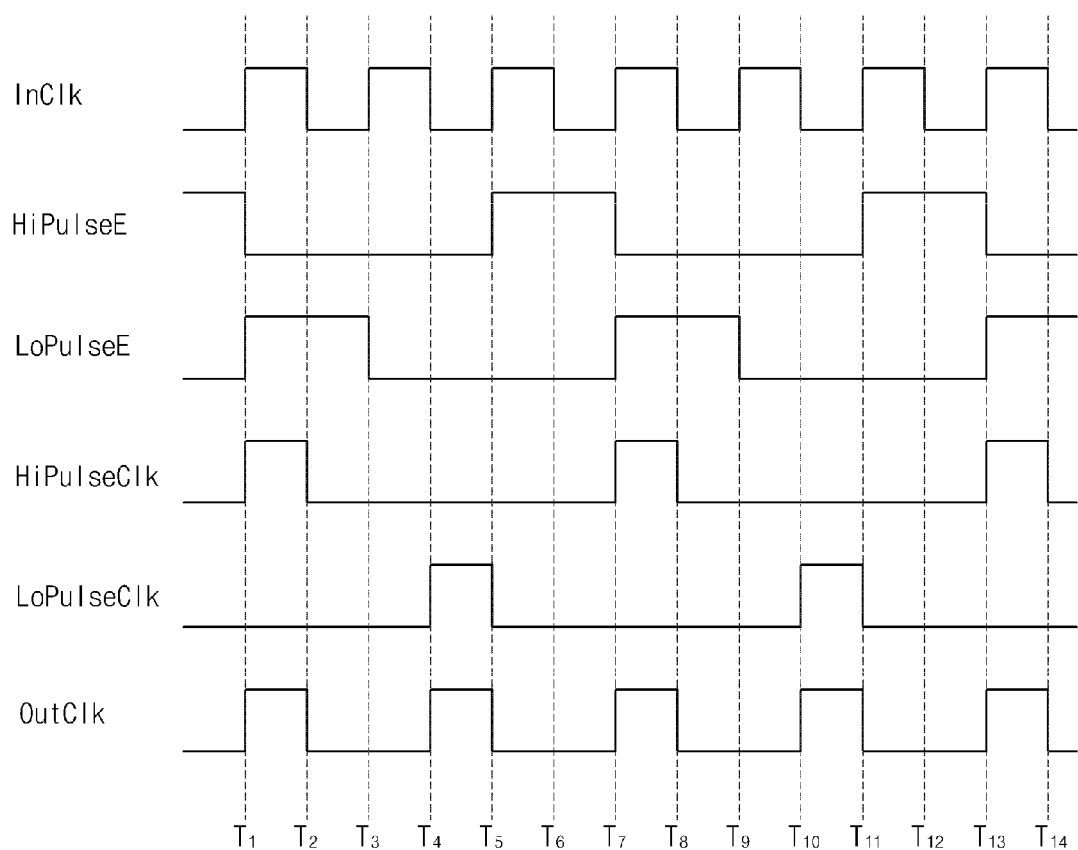
FIG. 7 is a diagram referred to in the description of FIG. 6.

FIG. 7 is a diagram referred to in the description of FIG. 6.

Referring to the drawing, the input clock signal InClk is at a high level from time T1 to time T2, a low level from time T2 to time T3, a high level from time T3 to time T4, a low level from time T4 to time T5, a high level from time T5 to time T6, a low level from time T6 to time T7, a high level from time T7 to time T8, a low level from time T8 to time T9, a high level from time T9 to time T10, a low level from time T10 to time T11, a high level from time T11 to time T12, and a low level from time T12 to time T13.

That is, the input clock signal InClk has a first frequency f1 and may alternate between high and low levels.

The input clock signal InClk may be generated in the clock distribution device 600 or the signal processing device 170, or may be input from the outside of the signal processing device 170.

The first pulse signal HiPulseE may be at a low level from time T1 to time T5, a high level from time T5 to time T7, a low level from time T7 to time T11, and a high level from time T11 to time T13.

The second pulse signal LoPulseE may be at a high level from time T1 to time T3, a low level from time T3 to time T7, a high level from time T7 to time T9, and a low level from time T9 to time T13.

In this case, the high levels of the first pulse signal HiPulseE and the second pulse signal LoPulseE preferably do not overlap each other.

Meanwhile, a period of the first pulse signal HiPulseE or the second pulse signal LoPulseE is from time T1 to T7, which may be three times a period of the input clock signal InClk.

That is, a frequency of the first pulse signal HiPulseE or the second pulse signal LoPulseE may be ⅓ times the frequency f1 of the input clock signal InClk.

The latch 610 operates based on the first pulse signal HiPulseE and the enable signal.

For example, a signal output from the latch 610 may be at a high level from time T1 to time T3, a low level from time T3 to time T6, a high level from time T6 to time T8, a low level from time T8 to time T11, and a high level from time T11 to time T13.

Meanwhile, the NAND gate 625 operates by receiving a signal output from the flip-flop 620 and the input clock signal InClk.

Accordingly, a signal output from the NAND gate 625 may be at a low level from time T1 to time T2, a high level from time T2 to time T7, a low level from time T7 to time T8, and a high level from time T8 to time T13.

Meanwhile, a level of the signal output from the NAND gate 625 is inverted by the second inverter 636, and the second inverter 636 outputs the first clock signal HiPulseEClk.

Accordingly, the first clock signal HiPulseEClk may be at a high level from time T1 to time T2, a low level from time T2 to time T7, a high level from time T7 to time T8, and a low level from time T8 to time T13.

Meanwhile, a level of the second pulse signal LoPulseE is inverted by the inverter 605, and the inverted second pulse signal LoPulseE is input to the flip-flop 620.

For example, the inverted second pulse signal LoPulseE input to the flip-flop 620 may be at a low level from time T1 to time T3, a high level from time T3 to time T7, a low level from time T7 to time T9, and a high level from time T9 to time T13.

Meanwhile, the flip-flop 620 operates by using, as clock signals, the inverted second pulse signal LoPulseE and the same signal as the enable signal input to the latch 610.

For example, the signal output from the flip-flop 620 may be at a high level from time T1 to time T3, a low level from time T3 to time T5, a high level from time T5 to time T9, a low level from time T9 to time T11, and a high level from T11.

Meanwhile, the OR gate 628 operates by receiving the signal output from the flip-flop 620 and the input clock signal InClk.

Accordingly, a signal output from the OR gate 628 may be at a high level from time T1 to time T4, a low level from time T4 to time T5, a high level from time T5 to time T10, a low level from time T10 to time T11, and a high level from T11.

Meanwhile, a level of the signal output from the OR gate 628 is inverted by a third inverter 636, and the third inverter 636 outputs the second clock signal LoPulseEClk.

Accordingly, the second clock signal LoPulseEClk may be at a low level from time T1 to time T4, a high level from time T4 to time T5, a low level from time T5 to time T10, a high level from time T10 to time T11, and a low level from T11.

Meanwhile, the second NAND gate 634 operates by receiving the output signal of the NAND gate 625 and the output signal of the OR gate 628.

Meanwhile, the output signal of the NAND gate 625 is at a low level from time T1 to time T2, a high level from time T2 to time T7, a low level from time T7 to time T8, and a high level from time T8 to time T13, and the signal output from the OR gate 628 has a high level from time T1 to time T4, a low level from time T4 to time T5, a high level from time T5 to time T10, a low level from time T10 to time T11, and a high level from T11.

Accordingly, a signal output from the second NAND gate 634 is at a high level from time T1 to time T2, a low level from time T2 to time T4, a high level from time T4 to time T5, a low level from time T5 to time T7, a high level from T7 to time T8, a low level from time T8 to time T10, a high level from time T10 to time T11, and a low level from time T11 to time T13.

In a waveform of FIG. 7, the second NAND gate 634 in the clock distribution device 600 according to an embodiment of the present disclosure may output an output clock signal OutClk having a period of 1.5 times a period of the input clock signal InClk. Accordingly, the output clock signal OutClk having a fractional division ratio may be simply generated based on the input clock signal InClk.

Meanwhile, in the waveform of FIG. 7, the first inverter 632 and the second inverter 636 in the clock distribution device 600 according to an embodiment of the present disclosure may output the first clock signal HiPulseEClk and the second clock signal LoPulseEClk, respectively, which have periods that are twice the period of the output clock signal OutClk.

That is, the second NAND gate 634 outputs an output clock signal OutClk having a higher frequency than the first clock signal HiPulseEClk and the second clock signal LoPulseEClk.

For example, a frequency of the output clock signal OutClk may be twice a frequency of the first clock signal HiPulseEClk and a frequency of the second clock signal LoPulseEClk. Accordingly, the input clock signal InClk may be simply distributed.

Meanwhile, the frequency of the output clock signal OutClk may be twice a frequency of the first clock signal HiPulseEClk and a frequency of the second clock signal LoPulseEClk. Accordingly, the input clock signal InClk may be simply distributed.

Accordingly, the clock distribution device 600 according to an embodiment of the present disclosure may output the output clock signal OutClk, the first clock signal HiPulseEClk, and the second clock signal LoPulseEClk, which have various periods or various frequencies, based on a single input clock signal InClk.

Meanwhile, the input clock signal InClk may be delayed by one cycle for the second pulse signal LoPulseE compared to the first pulse signal HiPulseE. Accordingly, the input clock signal InClk may be simply distributed.

Meanwhile, a period of the first pulse signal HiPulseE may be three times a period of the input clock signal InClk. Accordingly, the output clock signal OutClk having a fractional division ratio may be simply generated based on the input clock signal InClk.

Meanwhile, the clock distribution device 600 according to an embodiment of the present disclosure, implemented by using one latch and one flip-flop, may be considerably simplified compared to related arts 1 and 2 in which three or more flip-flops are used. Accordingly, power consumption may be reduced.

Meanwhile, a faster NAND gate is used in the clock distribution device 600 according to an embodiment of the present disclosure, such that a signal processing speed may increase substantially compared to related art 1 in which an AND gate is mainly used.

Meanwhile, compared to related art 2, there are no half-cycle paths in the flip-flop 620 of the clock distribution device 600 according to an embodiment of the present disclosure, and thus there is no need to double the effective frequency, thereby facilitating physical implementation.

Meanwhile, the clock distribution device 600 according to an embodiment of the present disclosure has a programmable division ratio, and thus is not limited to a fixed frequency. That is, the clock distribution device 600 according to an embodiment of the present disclosure consists of standard library cells and has a simple structure, such that the clock distribution device 600 may operate even at a high clock frequency.

Meanwhile, in the clock distribution device 600 according to an embodiment of the present disclosure, the output clock signal OutClk has equally spaced clock pulses, such that a period from a rising edge to the next rising edge is constant.

Meanwhile, the clock distribution device 600 according to an embodiment of the present disclosure may generate a clock signal having a frequency corresponding to input clock signal InClk/1.5.

Meanwhile, the clock distribution device 600 according to an embodiment of the present disclosure may output the first clock signal HiPulseEClk and the second clock signal LoPulseEClk that have different phases, without design costs in cnb.

Figure 8:
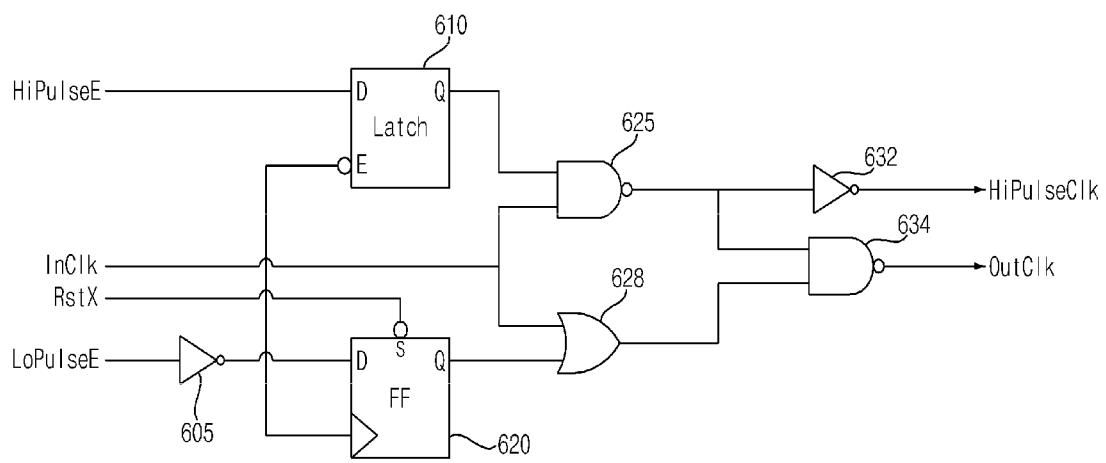
FIG. 8 is an example of a circuit diagram illustrating a clock distribution device according to another embodiment of the present disclosure.
Figure 9:
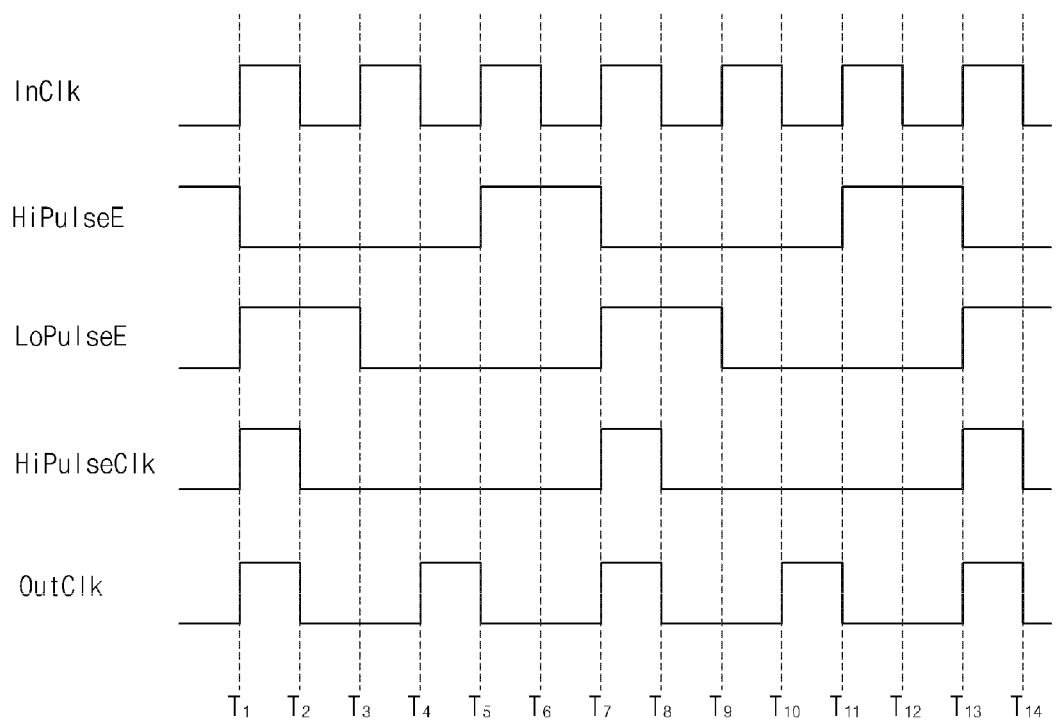
FIG. 9 is a diagram referred to in the description of FIG. 8.

FIG. 8 is an example of a circuit diagram illustrating a clock distribution device according to another embodiment of the present disclosure, and FIG. 9 is a diagram referred to in the description of FIG. 8.

Referring to the drawing, similarly to the clock distribution device 600 of FIG. 6, a clock distribution device 600*b* according to another embodiment of the present disclosure includes: a latch 610 to which, of a first pulse signal HiPulseE and a second pulse signal LoPulseE which have high levels that do not overlap each other, the first pulse signal HiPulseE is input; and a flip-flop 620 to which the second pulse signal LoPulseE, which is inverted, is input.

Meanwhile, similarly to the clock distribution device 600 of FIG. 6, a clock distribution device 600*b* according to another embodiment of the present disclosure further includes: a NAND gate 625 that operates by receiving an output signal of the latch 610 and an input clock signal InClk; an OR gate 628 that operates by receiving an output signal of the flip-flop 620 and the input clock signal InClk; a second NAND gate 634 that operates by receiving an output signal of the NAND gate 625 and an output signal of the OR gate 628; and a first inverter 632 inverting the output signal of the NAND gate 625.

However, unlike the clock distribution device 600 of FIG. 6, the clock distribution device 600*b* according to another embodiment of the present disclosure does not include the second inverter 636 inverting the output signal of the OR gate 628.

Accordingly, the clock distribution device 600*b* according to another embodiment of the present disclosure outputs an output clock signal OutClk based on the output signal of the latch 610, the input clock signal InClk, and the output signal of the flip-flop 620, and outputs the first clock signal HiPulseClk based on the output signal of the NAND gate 625, without outputting the second clock signal LoPulseClk.

Figure 10:
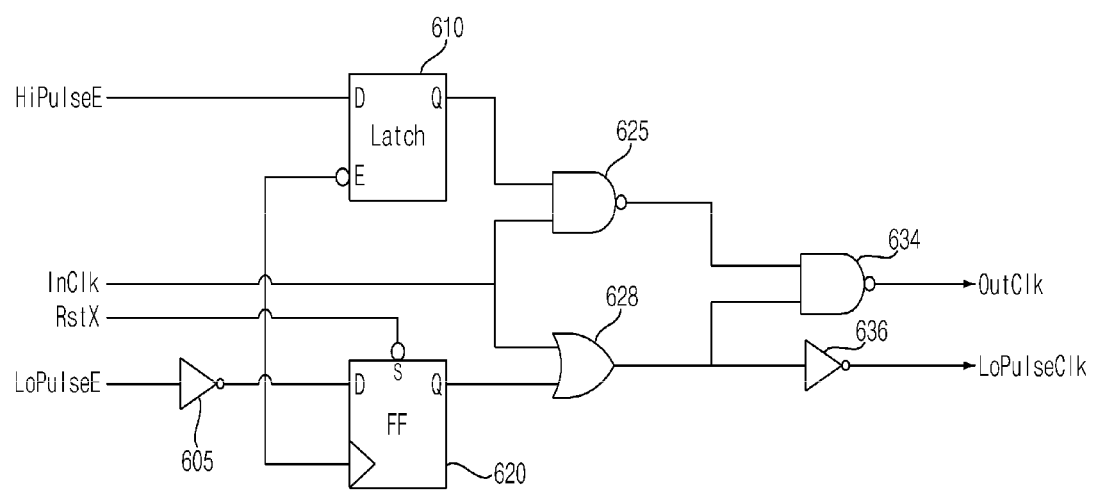
FIG. 10 is an example of a circuit diagram illustrating a clock distribution device according to further another embodiment of the present disclosure.
Figure 11:
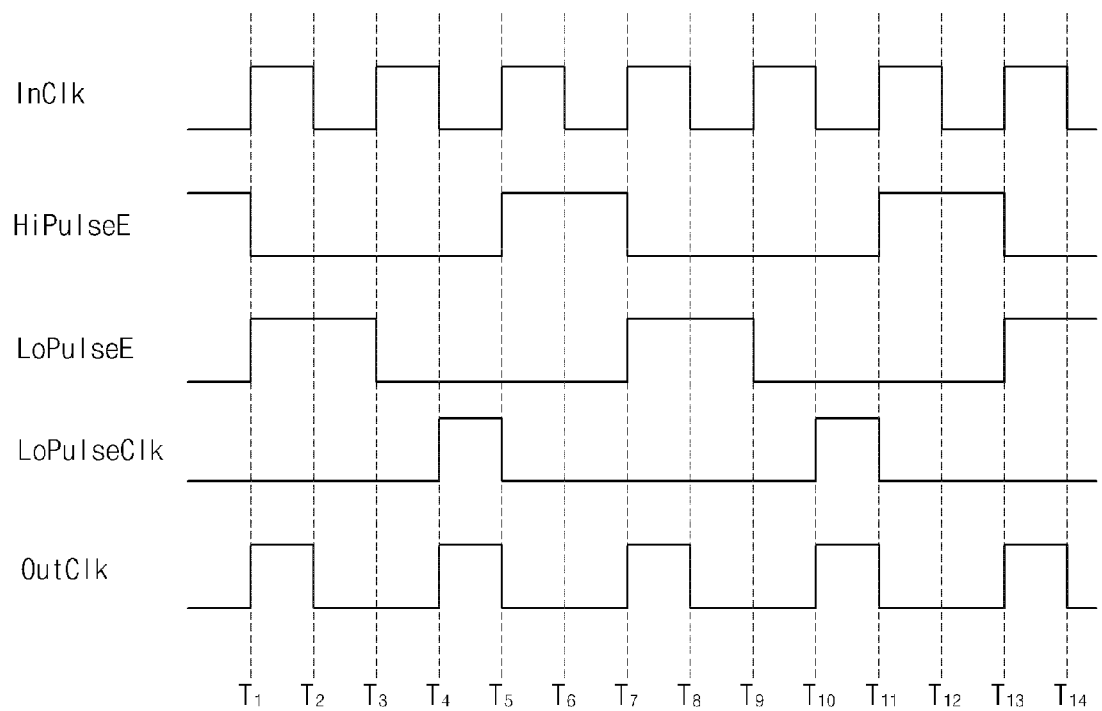
FIG. 11 is a diagram referred to in the description of FIG. 10.

FIG. 10 is an example of a circuit diagram illustrating a clock distribution device according to further another embodiment of the present disclosure, and FIG. 11 is a diagram referred to in the description of FIG. 10.

Referring to the drawing, similarly to the clock distribution device 600 of FIG. 6, a clock distribution device 600*c* according to further another embodiment of the present disclosure includes: a latch 610 to which, of a first pulse signal HiPulseE and a second pulse signal LoPulseE which have high levels that do not overlap each other, the first pulse signal HiPulseE is input; and a flip-flop 620 to which the second pulse signal LoPulseE, which is inverted, is input.

Meanwhile, similarly to the clock distribution device 600 of FIG. 6, the clock distribution device 600*c* according to further another embodiment of the present disclosure further includes: a NAND gate 625 that operates by receiving an output signal of the latch 610 and an input clock signal InClk; an OR gate 628 that operates by receiving an output signal of the flip-flop 620 and the input clock signal InClk; a second NAND gate 634 that operates by receiving an output signal of the NAND gate 625 and an output signal of the OR gate 628; and a second inverter 636 inverting the output signal of the OR gate 628.

However, unlike the clock distribution device 600 of FIG. 6, the clock distribution device 600*c* according to further another embodiment of the present disclosure does not include the first inverter 632 inverting the output signal of the NAND gate 625.

Accordingly, the clock distribution device 600c according to further another embodiment of the present disclosure outputs an output clock signal OutClk based on the output signal of the latch 610, the input clock signal InClk, and the output signal of the flip-flop 620, and outputs a second clock signal LoPulseClk based on the output signal of the OR gate 628, without outputting a first clock signal HiPulseClk.

It will be apparent that, although the preferred embodiments have been illustrated and described above, the present disclosure is not limited to the above-described specific embodiments, and various modifications and variations can be made by those skilled in the art without departing from the gist of the appended claims. Thus, it is intended that the modifications and variations should not be understood independently of the technical spirit or prospect of the present disclosure.

What is claimed is:

1. A clock distribution device comprising:
    a latch configured to receive a first pulse signal among the first pulse signal and a second pulse signal having non-overlapping high levels;
    a flip-flop configured to receive an inverted signal in which the second pulse signal is inverted;
    a first NAND gate configured to operate based on receiving an output signal of the latch and an input clock signal;
    an OR gate configured to operate based on receiving an output signal of the flip-flop and the input clock signal; and
    a second NAND gate configured to operate based on receiving an output signal of the first NAND gate and an output signal of the OR gate,
    wherein the second NAND gate outputs an output clock signal, and
    wherein the output clock signal is output based on the output signal of the latch, the input clock signal, and the output signal of the flip-flop.

2. The clock distribution device of claim 1, wherein the clock distribution device is configured to:
    output a first clock signal based on the output signal of the first NAND gate; and
    output a second clock signal based on the output signal of the OR gate.

3. The clock distribution device of claim 2, further comprising:
    a first inverter configured to invert the output signal of the first NAND gate; and
    a second inverter configured to invert the output signal of the OR gate,
    wherein the first clock signal corresponds to an output signal of the first inverter, and the second clock signal corresponds to an output signal of the second inverter.

4. The clock distribution device of claim 1, wherein the second NAND gate outputs the output clock signal having a period of 1.5 times a period of the input clock signal.

5. The clock distribution device of claim 2, wherein the second NAND gate outputs the output clock signal having a higher frequency than the first clock signal and the second clock signal.

6. The clock distribution device of claim 2, wherein a frequency of the output clock signal is twice a frequency of the first clock signal and a frequency of the second clock signal.

7. The clock distribution device of claim 1, wherein the input clock signal is delayed by one cycle for the second pulse signal compared to the first pulse signal.

8. The clock distribution device of claim 1, wherein a period of the first pulse signal is three times a period of the input clock signal.

9. The clock distribution device of claim 1, wherein an enable signal input to the latch is a same signal as a clock signal input to the flip-flop.

10. The clock distribution device of claim 1, wherein in response to a reset signal being input to the flip-flop, an operation of the flip-flop is reset.

11. A clock distribution device comprising:
    a latch configured to receive a first pulse signal among the first pulse signal and a second pulse signal having non-overlapping high levels;
    an inverter configured to invert the second pulse signal;
    a flip-flop configured to receive an output signal of the inverter;
    a first NAND gate configured to operate based on receiving an output signal of the latch and an input clock signal;
    an OR gate configured to operate based on receiving an output signal of the flip-flop and the input clock signal; and
    a second NAND gate configured to operate based on receiving an output signal of the first NAND gate and an output signal of the OR gate, and output an output clock signal.

12. The clock distribution device of claim 11, wherein the second NAND gate outputs the output clock signal having a period of 1.5 times a period of the input clock signal.

13. The clock distribution device of claim 11, further comprising:
    a second inverter configured to invert the output signal of the first NAND gate and outputting a first clock signal; and
    a third inverter configured to invert the output signal of the OR gate and outputting a second clock signal.

14. An image display apparatus comprising:
    a display; and
    a signal processing device including a clock distribution device,
    wherein the clock distribution device comprises:
        a latch configured to receive a first pulse signal among the first pulse signal and a second pulse signal having non-overlapping high levels;
        a flip-flop configured to receive an inverted signal in which the second pulse signal is inverted;
        a first NAND gate configured to operate based on receiving an output signal of the latch and an input clock signal;
        an OR gate configured to operate based on receiving an output signal of the flip-flop and the input clock signal; and
        a second NAND gate configured to operate based on receiving an output signal of the first NAND gate and an output signal of the OR gate,
    wherein the second NAND gate outputs an output clock signal, and
    wherein the output clock signal is output based on the output signal of the latch, the input clock signal, and the output signal of the flip-flop.

15. The image display apparatus of claim 14, wherein the clock distribution device is configured to:
    output a first clock signal based on the output signal of the first NAND gate; and output a second clock signal based on the output signal of the OR gate.

16. The image display apparatus of claim 15, wherein the clock distribution device further comprises:
- a first inverter configured to invert the output signal of the first NAND gate; and
- a second inverter configured to invert the output signal of the OR gate,
- wherein the first clock signal corresponds to an output signal of the first inverter, and the second clock signal corresponds to an output signal of the second inverter.

17. The image display apparatus of claim 15, wherein the second NAND gate outputs the output clock signal having a higher frequency than the first clock signal and the second clock signal.

18. The image display apparatus of claim 14, wherein in response to a reset signal being input to the flip-flop, an operation of the flip-flop is reset.

* * * * *